United States Patent
Chadwick, Jr. et al.

(10) Patent No.: US 8,015,526 B2
(45) Date of Patent: *Sep. 6, 2011

(54) STATIC TIMING SLACKS ANALYSIS AND MODIFICATION

(75) Inventors: Thomas B. Chadwick, Jr., Essex Junction, VT (US); Margaret R. Charlebois, Jericho, VT (US); David J. Hathaway, Underhill, VT (US); Jason E. Rotella, Mineville, NY (US); Douglas W. Stout, Milton, VT (US); Ivan L. Wemple, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 440 days.

This patent is subject to a terminal disclaimer.

(21) Appl. No.: 12/138,871

(22) Filed: Jun. 13, 2008

(65) Prior Publication Data
US 2008/0270962 A1   Oct. 30, 2008

Related U.S. Application Data

(63) Continuation of application No. 11/277,385, filed on Mar. 24, 2006, now Pat. No. 7,404,163.

(51) Int. Cl.
*G06F 17/50* (2006.01)
(52) U.S. Cl. ........................................ 716/108; 716/109
(58) Field of Classification Search .................. 716/4–6, 716/106–109
See application file for complete search history.

(56) References Cited

U.S. PATENT DOCUMENTS

| | | | |
|---|---|---|---|
| 7,142,991 B2 * | 11/2006 | Hathaway et al. | 702/57 |
| 7,174,523 B2 | 2/2007 | Engel et al. | |
| 7,278,120 B2 | 10/2007 | Rahmat et al. | |
| 7,404,163 B2 * | 7/2008 | Chadwick et al. | 716/6 |

OTHER PUBLICATIONS

U.S. Appl. No. 11/277,385, filed Mar. 24, 2006, Notice of Allowance and Fees due dated Apr. 22, 2008.
U.S. Appl. No. 11/277,385, filed Mar. 24, 2006, Office Action dated Oct. 22, 2007.

* cited by examiner

*Primary Examiner* — Jack Chiang
*Assistant Examiner* — Binh C Tat
(74) *Attorney, Agent, or Firm* — Richard M. Kotulak; Hoffman Warnick LLC

(57) ABSTRACT

A method, system and computer program product for analyzing and modifying a static timing slack of a timing path in a static timing analysis of a design of an integrated circuit (IC) with a transient power supply are disclosed. A static timing slack analysis is performed at a selected endpoint in an IC to obtain a candidate timing path leading to the endpoint with a worst static timing slack. A transient static timing slack is determined for the candidate timing path for each clock cycle of a clock signal under the transient power supply. The determined transient static timing slack is used to adjust the timing of the IC and to modify the static timing slack of the candidate timing path.

17 Claims, 6 Drawing Sheets

STATIC TIMING SLACKS ANALYSIS AND MODIFICATION

CROSS-REFERENCE TO RELATED APPLICATION

"This patent application is a Continuation of patent application Ser. No. 11/277,385, filed Mar. 24, 2006 now U.S. Pat. No. 7,404,163."

FIELD OF THE INVENTION

The present invention generally relates to the field of integrated circuit design, and more particularly relates to analyzing and modifying a static timing slack to solve the problem of a transient power supply in an integrated circuit design

BACKGROUND OF THE INVENTION

In an integrated circuit (IC) design, delay values in a static timing analysis are dependent upon a power supply voltage value, e.g., a positive power supply (VDD) minus a reference power supply, or ground, (GND). VDD and GND values may vary both spatially, i.e., across different locations on an IC chip, and/or temporally, i.e., in time. A power supply with such spatial and/or temporal variations of voltage values may be referred to as a transient power supply. In an IC design, specifically, a timing analysis of an IC design, problems of a transient power supply need to be considered and accommodated.

Efforts have been made to accommodate the problem of transient power supply in IC designs. For example, some approaches use a one-for-all (global) supply voltage value (VDD-GND) to calculate delays for each and all elements (or blocks of elements) in an IC chip during a static timing analysis. Alternatively, a pair of global supply values (upper end v. lower end) may be specified, where the upper end is used to calculate early mode delays and the lower end is used to calculate late mode delays. These approaches are disadvantageous in that they do not account for either the temporal or the spatial variations in voltage value.

Some other approaches analyze a power bus (e.g., via a simulation) to determine a power supply voltage value at each location (of elements) in an IC chip. A voltage value based on leakage current or average current demand at a location of an element is then used to calculate a delay for the element. These approaches are disadvantageous because they fail to account for temporal variation in supply voltage. In addition, these approaches do not directly relate a voltage value used in a timing analysis to a power bus analysis, e.g., a power bus simulation.

Hathaway et al. (U.S. patent application Ser. No. 11/095,327, incorporated herein by reference) provide a superposition-based method. According to Hathaway et al., separate power bus analyses are performed to obtain the transient voltage responses resulting from different switching objects or groups of switching objects on the chip. These separate power bus analyses are then used in a static timing analysis to obtain the worst timing behavior that can occur for any combination (or any "allowed" combination) of these switching objects or groups of objects. Hathaway et al. account for both spatial and temporal power supply variations, and provide better coverage of all possible chip activity patterns. Unfortunately, the run time cost for determining the worst case superposition of activities may be quite expensive.

Based on the above, there is a need to analyze static timing of an IC element with a transient power supply in consideration of a static timing slack of the element in the context of a timing path.

SUMMARY OF THE INVENTION

A method, system and computer program product for analyzing and modifying a static timing slack of a timing path in a static timing analysis of a design of an integrated circuit (IC) with a transient power supply are disclosed. A static timing slack analysis is performed at a selected endpoint in an IC to obtain a candidate timing path leading to the endpoint with a worst static timing slack. A transient static timing slack is determined for the candidate timing path for each clock cycle of a clock signal under the transient power supply. The determined transient static timing slack is used to adjust the timing of the IC and to modify the static timing slack of the candidate timing path.

A first aspect of the invention is directed to a method for analyzing and modifying a static timing slack of a timing path in a static timing analysis of a design of an integrated circuit (IC) with a transient power supply, the method comprising steps of: constructing a timing model of an IC based on an upper end voltage supply and a lower end voltage supply; selecting an endpoint in the IC to perform a static timing slack analysis on the endpoint based on the upper end voltage supply and the lower end voltage supply; selecting a candidate timing path with a bounded static timing slack of a minimum value among all timing paths leading to the selected endpoint based on the static timing slack analysis; determining a transient static timing slack of the candidate timing path based on the transient power supply; and modifying the bounded static timing slack of the candidate timing path based on the transient static timing slack.

A second aspect of the invention is directed to a system for analyzing and modifying a static timing slack of a timing path in a static timing analysis of a design of an integrated circuit (IC) with a transient power supply, the system comprising: means for selecting an upper end voltage supply and a lower end voltage supply to be used in constructing a timing model of an IC; means for selecting an endpoint in the IC to perform a static timing slack analysis on the endpoint based on the upper end voltage supply and the lower end voltage supply; means for selecting a candidate timing path with a bounded static timing slack of a minimum value among all timing paths leading to the selected endpoint based on the static timing slack analysis; means for determining a transient static timing slack of the candidate timing path based on the transient power supply; and means for modifying the bounded static timing slack of the candidate timing path based on the transient static timing slack.

A third aspect of the invention is directed to a computer program product for analyzing and modifying a static timing slack of a timing path in a static timing analysis of a design of an integrated circuit (IC) with a transient power supply, the computer program product comprising: computer usable program code configured to: select an upper end voltage supply and a lower end voltage supply to be used in constructing a timing model of an IC; select an endpoint in the IC to perform a static timing slack analysis on the endpoint based on the upper end voltage supply and the lower end voltage supply; select a candidate timing path with a bounded static timing slack of a minimum value among all timing paths leading to the selected endpoint based on the static timing slack analysis; determine a transient static timing slack of the candidate timing path based on the transient power supply; and modify the bounded static timing slack of the candidate timing path based on the transient static timing slack.

Other aspects and features of the present invention, as defined solely by the claims, will become apparent to those ordinarily skilled in the art upon review of the following non-limited detailed description of the invention in conjunction with the accompanying figures.

BRIEF DESCRIPTION OF THE DRAWINGS

The embodiments of this invention will be described in detail, with reference to the following figures, wherein like designations denote like elements, and wherein.

DETAILED DESCRIPTION

The following detailed description of embodiments refers to the accompanying drawings, which illustrate specific embodiments of the invention. Other embodiments having different structures and operations do not depart from the scope of the present invention.

1. DEFINITIONS

An element refers to any circuit component of an integrated circuit.

An endpoint refers to any element of an integrated circuit.

A clock pin of an element refers to an input terminal of the element that receives a clock signal.

A data pin of an element refers to an input terminal of the element that receives a data signal.

A clock source refers to any element of an integrated circuit that propagates a clock signal.

A clock path refers to a path through which a clock signal arrives at an element.

A timing path refers to a path through which a signal from a sending element arrives at a receiving element. A timing path may include a clock path leading to the sending element.

2. COMPUTER SYSTEM

Figure 1:
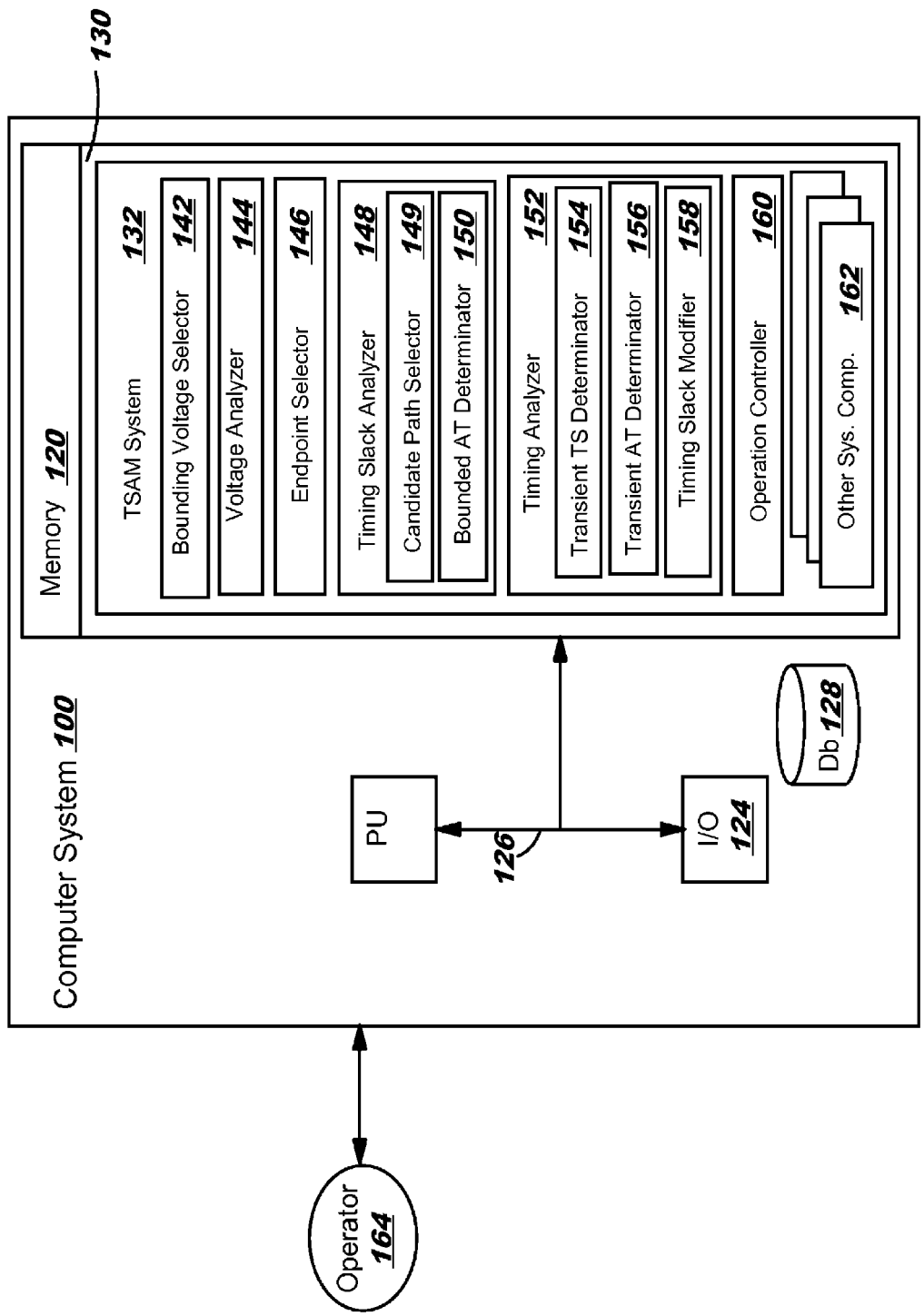
FIG. 1 shows a block diagram of an illustrative computer system according to the invention.

Referring to FIG. 1, a block diagram of an illustrative computer system 100 according to the present invention is shown. In one embodiment, computer system 100 includes a memory 120, a processing unit (PU) 122, input/output devices (I/O) 124 and a bus 126. A database 128 may also be provided for storage of data relative to processing tasks.

Memory 120 includes a program product 130 that, when executed by PU 122, comprises various functional capabilities described in further detail below. Memory 120 (and database 128) may comprise any known type of data storage system and/or transmission media, including magnetic media, optical media, random access memory (RAM), read only memory (ROM), a data object, etc. Moreover, memory 120 (and database 128) may reside at a single physical location comprising one or more types of data storage, or be distributed across a plurality of physical systems. PU 122 may likewise comprise a single processing unit, or a plurality of processing units distributed across one or more locations. I/O 124 may comprise any known type of input/output device including a network system, modem, keyboard, mouse, scanner, voice recognition system, CRT, printer, disc drives, etc. Additional components, such as cache memory, communication systems, system software, etc., may also be incorporated into computer system 100.

As shown in FIG. 1, program product 130 may include a timing slack analysis and modification (TSAM) system 132 that includes a bounding voltage selector 142; a voltage analyzer 144; an endpoint selector 146; a timing slack analyzer 148 including a candidate path selector 149 and a bounded arrival time (AT) determinator 150; a timing analyzer 152 including a transient timing slack (TS) determinator 154, a transient arrival time (AT) determinator 156, and a timing slack modifier 158; an operation controller 160; and other system components 162. Other system components 162 may include any now known or later developed parts of a computer system not individually delineated herein, but understood by those skilled in the art.

Computer system 100 is responsive to an operator 164 during the operation of TSAM system 132. For example, operator 164 may enter stimulus into computer system 100 for voltage analyzer 144 to simulate a voltage waveform of a transient voltage supply provided to an element of interest. Also operator 164 may instruct whether to prioritize a timing path in the operation of TSAM system 132. Results of a timing slack analysis and modification operation may be returned to the operator for the operator to revise/conform a design of an IC. The operation of TSAM system 132 will be described in details below.

3. TIMING SLACK ANALYSIS AND MODIFICATION SYSTEM

Timing slack analysis and modification (TSAM) system 132 functions generally to analyze and modify a timing slack of a timing path that leads to an endpoint of an IC. One embodiment of the operation of TSAM system 132 is shown in the flow diagram of FIG. 2.

Figure 2:
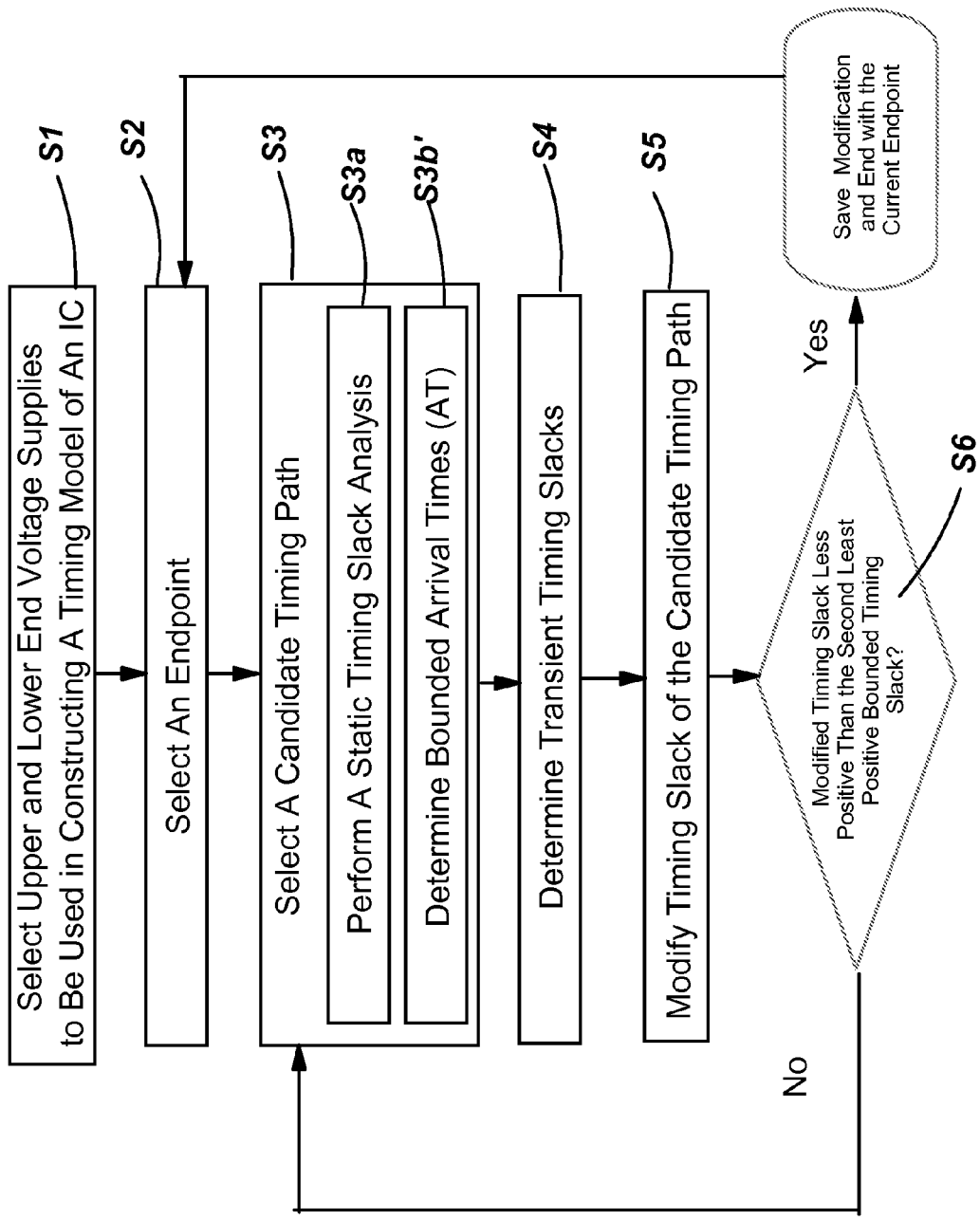
FIG. 2 shows a flow diagram of one embodiment of an operation of a timing slack analysis and modification (TSAM) system according to the invention.

Referring to FIGS. 1 and 2, first in step S1, bounding voltage selector 142 selects/sets up an upper end voltage supply and a lower end voltage supply for each element on an IC chip. The upper end voltage supply and the lower end voltage supply for an element are referred to together as an initial pair of bounding voltage supplies. The selected initial set of pairs of bounding voltage supplies is used, together with other IC design parameters, for example, timing assertions and chip netlist design, to initially construct a timing model of an IC. For example, the upper end voltage supply for an element in the IC chip may be used to calculate an early mode delay of that element; and the lower end voltage supply for the element may be used to calculate a late mode delay of the element. It is appreciated that any forms of voltage supplies may be included in the selected initial set of pairs of bounding voltage supplies. In the following description, a difference between a positive voltage supply (VDD) and a ground (GND) is used as an illustrative example of a voltage supply. A common pair of upper and lower bounding voltage supplies may be applied to all elements on the IC chip. Alternatively, separate bounding voltage supplies may be applied to each element. Further details regarding a timing design with respect to other IC design parameters, for example, a timing assertion and a chip netlist design, are not necessary for an understanding of the invention and will not be provided.

Accordingly to one embodiment, the initial pair of bounding voltage supplies for an element on the IC chip may be selected based on the maximum (upper end) and minimum (lower end) voltage supply (VDD-GND) of the IC chip provided by a transient power supply at the location of the element. The maximum and minimum voltage supplies may be determined based on a voltage waveform of the transient power supply at the location of the element. The voltage waveforms may be determined by a variety of methods, including, but not limited to, circuit simulation, extraction from a pre-characterized power rule, measurement of a gate level (hardware) implementation of a pre-manufactured instance of the IC design, and any combinations thereof. According to one embodiment, voltage analyzer 144 (FIG. 1) simulates a voltage waveform provided by the transient power supply at the location of each element on the IC chip. It is appreciated that the set of initial pairs of bounding voltages needs not comprise maximum and minimum voltage supplies. Any methods of selecting the set of initial pairs of bounding voltage supplies, including a random selection, are similarly included in the present invention.

Applying the selected set of initial pairs of bounding voltage supplies to the IC, timing slack analyzer 148 may optionally perform a low effort timing optimization step. This IC optimization step may involve major or minor changes to the IC to meet timing requirements under application of the bounding voltage supplies. Possible changes to the IC include, e.g., resizing of a die, more decoupling capacitors on or off the die, package design changes, replacement and resizing of existing IC elements, removing IC elements, adding small numbers of IC elements, changes in the connectivity between IC elements, and changes to the relative locations of IC elements to improve voltage disturbance and sensitivity, etc. Optimizations that involve a high cost, e.g., those that have long run times, add significant powers or areas, or significantly reduce yield or wirability, may not be used. The reason is that the bounding voltage supplies used to drive the optimization are pessimistic and the timing of the IC may be modified as will be described later, and thus exerting substantial efforts to change the IC at this step may be wasteful. If this optional timing optimization is performed, the timing of the IC may be updated according to the results of the optimization.

Next in step S2, endpoint selector 146 selects an (or a set of) endpoint in the IC on which timing slack analyzer 148 performs a static timing slack analysis based on the set of initial pairs of bounding voltage supplies. Any now known or later developed standards/tests may be used in the selection of endpoints, and are included in the current invention. For example, endpoint selector 146 may select the endpoints that that have timing slacks falling below some specified threshold. Alternatively, the endpoints may also be selected with a filtering and prioritizing test scheme based on policies regarding a designed clock network, and/or on knowledge of the IC design. According to one embodiment, in the selection of endpoints, priorities may be assigned to the elements that are essential in a clock path tracing and an arrival time determination for a given compliant policy. For example, memory elements (e.g., latches) may be suitable candidates to be selected as endpoints for analysis. Clock inputs of memory elements may be used in the analysis. Alternatively, a set of data and clock inputs of a memory element may be used. Choosing only endpoints in timing paths simplifies timing analysis by limiting the portion of the IC design that requires reanalysis/modification as will be described later. In addition, selecting only endpoints in timing paths also limits the number of modifications required to be done with each individual endpoint. In the following description, latches, or flip-flops, in timing paths are used as illustrative examples of endpoints selected for a timing slack analysis.

Figure 3:
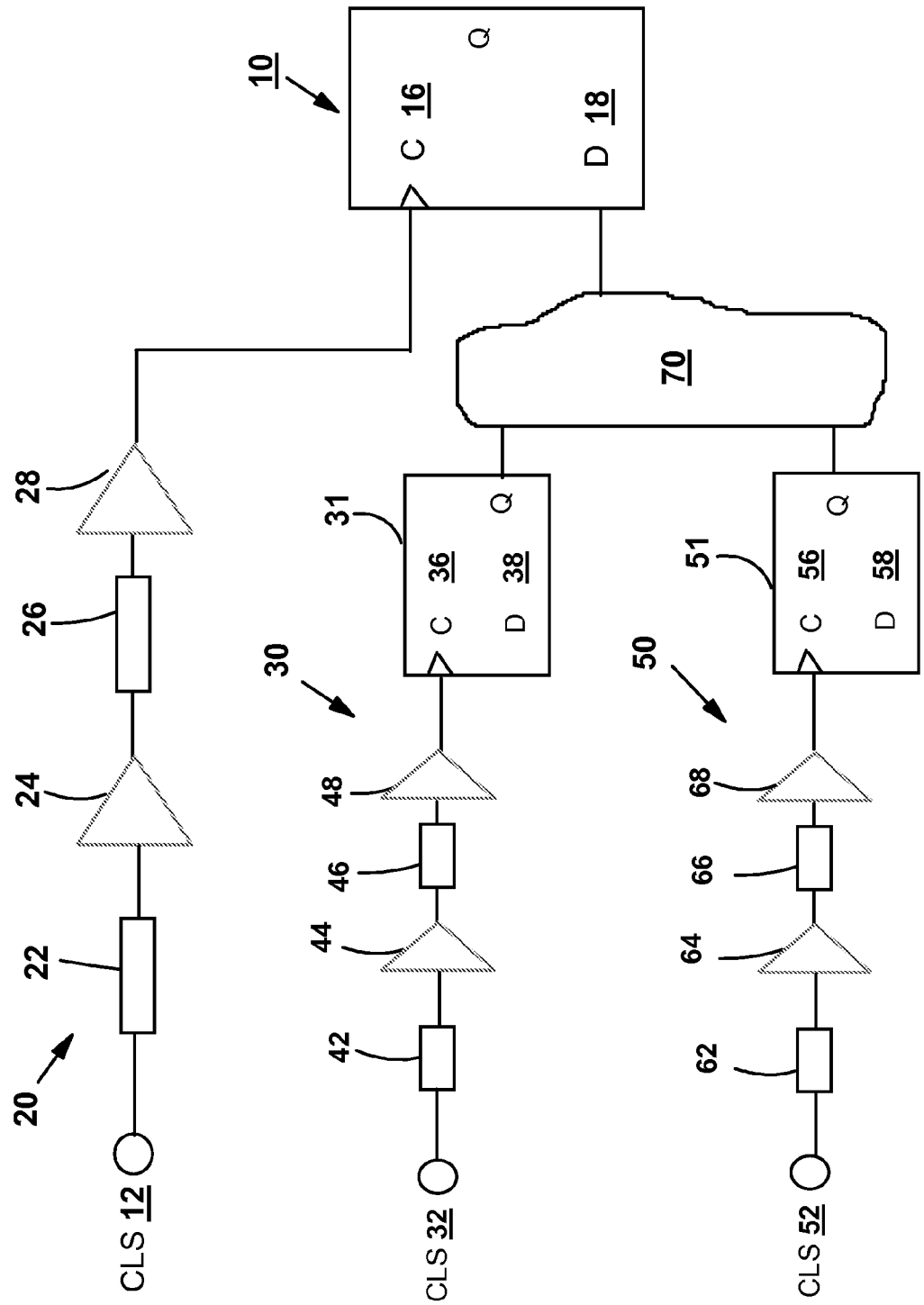
FIG. 3 shows an example of an endpoint with two timing paths leading to the endpoint according to one embodiment of the invention.

FIG. 3 shows an example of an endpoint 10 with a clock path 20 and two timing paths 30 and 50 leading to it. Specifically, in clock path 20, a clock signal is propagated from clock source (CLS) 12 through chip wirings 22 and 26 and buffers 24 and 28 to a clock pin (C) 16 of endpoint 10. Timing path 30 includes a latch 31 that sends data through logic 70 to a data pin (D) 18 of endpoint 10. Latch 31 includes a clock pin (C) 36 and a data pin (D) 38. In timing path 30, a clock signal is propagated from clock source (CLS) 32 through chip wirings 42 and 46 and buffers 44 and 48 to a clock pin (C) 36 of latch 31 to propagate a data output of latch 31. Timing path 50 includes a latch 51 that sends data through logic 70 to data pin (D) 18 of endpoint 10. Latch 51 includes a clock pin (C) 56 and a data pin (D) 58. In timing path 50, a clock signal is propagated from clock source (CLS) 52 through chip wirings 62 and 66 and buffers 64 and 68 to clock pin (C) 56 of latch 51 to propagate a data output of latch 51. In the following description, endpoint 10 will be used as an illustrative example of a selected endpoint. It should be appreciated that timing paths 30, 50 and clock path 20 in FIG. 3 are used for illustrative purpose only and do not limit the scope of the invention. An endpoint with any kinds of timing paths and clock paths leading to it is included in the current invention. For example, a timing path may include a clock path only without a data path. In addition, it should be appreciated that in the description, the designations "timing path" and "clock path" are for illustration only to differentiate two separate signal paths. The designations "timing path" and "clock path" do not characterize either signal path. For example, in FIG. 3, path 20 may be referred to as a "timing path" and path 30 may be referred to a "clock path" without changing the scope of the current invention. Moreover, the following operations of TSAM system 132 may also apply if path 20 is a timing path and path 30 is a clock path. Further, computation of a slack value may depend on arrival time information from a pair of timing paths, typically a clock path and a data path. When such slack computation methods are used, it will be understood that any reference to the slack of a path to an endpoint means the slack computed based on the specified path in combination with a clock path to the endpoint.

Referring back to FIGS. 1 and 2, next in step S3, timing slack analyzer 148 selects a candidate timing path for a static timing slack modification. Specifically, in step S3a slack analyzer 148 performs a static timing slack analysis of the selected endpoint based on the initial set of pairs of bounding voltage supplies to select a candidate timing path. As the analysis is based on the initial set of pairs of bounding voltage supplies used in constructing the timing model, the static timing slacks generated in the analysis are referred to as bounded static timing slacks. Specifically, according to one embodiment, timing analyzer 148 first produces timing reports regarding all timing paths leading to endpoint 10, i.e., timing paths 30 and 50, under the set of initial pairs of bounding voltage supplies selected in step S1. Various methods may be used to generate a timing report, and are included in the current invention. For example, according to one embodiment, the EinsTimer™ statistical timing tool available from IBM may be used to generate a timing report.

Next, based on the results of the analysis, candidate path selector 149 selects a candidate timing path with a bounded static timing slack of a minimum value among all timing paths leading to the selected endpoint 10. Candidate path selector 149 sorts the generated timing reports such that a timing path with a bounded static timing slack of a minimum value among all timing paths is listed on the top. The bounded static timing slack with the minimum value is referred to as the minimum bounded timing slack. Various types of bounded static timing slacks may be determined, including but not limited to: setup slacks, hold slacks, clock gating slacks, pulse width slacks, and pulse separation slacks. In this description, a setup static timing slack of a timing path leading to an endpoint may be determined by the following equation:

Setup timing slack=clock arrival time+clock cycle adjust−timing path signal arrival time−guard time (1a)

where clock arrival time denotes an arrival time of a clock signal at the endpoint; clock cycle adjust denotes a time adjustment based on a clock cycle difference between the clock signal of the endpoint and a clock signal of a data sending element in the timing path that sends data to the endpoint; data arrival time denotes an arrival time of a data signal from the data sending element in the timing path at the endpoint; and guard time is a separation between the clock and data arrival times at the endpoint that is required for the endpoint element to operate correctly. According to one embodiment, in the timing report, a worst case of the setup timing slack, i.e., an early clock arrival time and a late data arrival time is used for analysis. It should be appreciated that uses of other modes of arrival times for analyses and other formulae for slack are also included in the current invention. In particular, a hold timing slack may be may be determined by the following equation:

Hold timing slack=timing path signal arrival time−clock arrival time−clock cycle adjust−guard time (1b)

where the various terms are as described for equation (1a), and a worst case of the hold timing slack would typically be determined using a late clock arrival time and an early timing path signal (e.g., data) arrival time. In addition, it should be appreciated that other manners of determining a static timing slack are similarly included in the scope of the current invention. In the following description, a setup timing slack is used as an illustrative example of a timing slack to describe the operation of TSAM system 132.

For sake of illustration, in the following description, it is assumed that a worst timing slack value of −283 is obtained for timing path 30 (FIG. 3) and a worst timing slack value of −227 is obtained for timing path 50 (FIG. 3) in step S3. As explained previously, each of these path slacks is computed by combining information from clock path 20 with information from timing paths 30 and 50, respectively. As such, candidate path selector 149 selects the timing path with the minimum bounded timing slack, here timing path 50 with a timing slack value of −283, as the candidate timing path for the following steps of the operation of TSAM system 132. As will be shown later, if after a timing slack modification, the current minimum bounded timing slack becomes more positive than another bounded timing slack, here, e.g., −227 for timing path 50 (FIG. 3), the other bounded timing slack becomes the new minimum bounded timing slack and the timing path with the new minimum bounded timing slack, e.g., timing path 50, will then be selected as a candidate timing path.

Step S3 may include an optional step S3b'. In step S3b', bounded arrival time (AT) determinator 150 of timing slack analyzer 148 determines a bounded early mode arrival time for each element in clock path 20 and a bounded late mode arrival time for each element in the candidate timing path 30. The early and late mode bounded arrival times are determined based on the initial set of pairs of bounding voltage supplies. Specifically, the upper end voltage supply at the location of an element in clock path 20 is used to calculate an early delay of the element, and the lower end voltage supply at the location of an element in candidate timing path 30 is used to calculate a late mode delay of the element. For example, early mode delays of buffers 24 and 28 may be calculated using the upper end voltage supplies at their respective locations, and late mode delays of buffers 44 and 48 may be calculated using the lower end voltage supplies at their respective locations. As is known in the art, delays of chip wirings 22, 26, 42 and 46 are not directly dependent on voltage values on the IC. As such, in the current description, an early mode delay and a late mode delay of a chip wiring (22, 26, 42 and 46) are assumed to have a same value for sake of simplicity. It is appreciated that chip wirings may propagate signals with early and late mode delays, which is similarly included in the scope of the current invention.

Various methods may be used to determine an arrival time at an element under the initial pair of bounding voltage supplies and are all included in the current invention. For example, according to one embodiment, for clock path 20, an early mode bounded arrival time of a clock cycle at clock pin 16 (FIG. 3) may be determined according to the following formula:

AT_early=AT_12+delay_22+delay_24_early+delay_26+delay_28_early (2)

where AT_12 indicates the arrival time of the active edge of the clock cycle at clock source (CLS) 12; delay_22 indicates the delay due to chip wiring 22; delay_24_early indicates the early mode delay of buffer 24 calculated under the upper end voltage supply; delay_26 indicates the delay due to chip wiring 26; and delay_28_early indicates the early mode delay of buffer 28 calculated under the upper end voltage supply.

For candidate timing path 30, a late mode bounded arrival time of a clock signal at clock pin 36 (FIG. 3) may be determined according to the following formula:

AT_late=AT_32+delay_42+delay_44_late+delay_46+delay_48_late (3)

where AT_32 indicates the arrival time of the active edge of the clock cycle at clock source (CLS) 32; delay_42 indicates the delay due to chip wiring 42; delay_44_late indicates the late mode delay of buffer 44 calculated under the lower end voltage supply; delay_46 indicates the delay due to chip wiring 46; and delay_28_late indicates the late mode delay of buffer 28 calculated under the lower end voltage supply.

It should be appreciated that the above formulae (2) and (3) may be used for any clock cycle. As is appreciated, for different clock cycles, the arrival times at a clock source (12, 32) are different. For example, if AT_12 for clock cycle 1 is assumed to be 0, AT_12 for clock cycle n will be (n−1)*T, where T indicates a length of clock cycle. Clock cycle length T may be determined in the chip timing design under the initial bounding voltage supplies. As is appreciated, because the same initial set of pairs of bounding voltage supplies is used to calculate delays for all clock cycles, the obtained arrival times for different clock cycles are different only due to different clock arrival time at clock source (12, 32).

It should be appreciated that step S3b' may be included in the static timing analysis of step S3a because a method of generating a timing report may inherently include a determination of arrival times. In this case, bounded arrival time (AT) determinator 150 may simply obtain the already generated arrival times for candidate timing path 30 from a data storage mechanism, e.g., database 128.

Next in step S4, transient timing slack determinator 154 of timing analyzer 152 determines a transient static timing slack of candidate timing path 30 based on the transient power supply. Formula (1a) or (1b) described above may be used in the determination of the transient static timing slack. According to one embodiment, as has been described above, a worst case of the setup timing slack, i.e., an early clock arrival time and a late data arrival time, is of concern here. However, other manners of determining a transient timing slack are also included in the current invention. According to one embodiment, transient arrival time determinator 156 determines a early mode transient arrival time for a clock signal from clock source 12 to arrive at clock pin 16, and determines a late mode transient arrival time for a data signal from latch 31 to arrive at data pin 18 (FIG. 3). It is appreciated that an early mode transient arrival time for a clock signal through clock path 20 and a late mode arrival time for a data signal through candidate timing path 30 are used to determine a worst case of a setup timing slack. To determine other types of timing slack, other types of the arrival times may be used. For example, to determine a hold timing slack of candidate timing path 30, an early mode arrival time of a data signal through candidate timing path 30 and a late mode arrival time of a clock signal through clock path 20 will be used. Any now known or later developed methods may be used to determine a transient arrival time for a signal to arrive at endpoint 10 under the transient power supply, and are included in the current invention. For example, a path tracing or the well known "block-oriented" timing analysis methods may be used to determine an arrival time under a transient power supply. According to one embodiment, the early mode transient arrival time of the clock signal and the late mode transient arrival time of the data signal may be determined by a path tracing.

In the path tracing, transient arrival time determinator 156 determines an early mode transient arrival time for a clock signal from clock source 12 to arrive at each element in clock path 20 by calculating an early mode delay of each element in clock path 20 based on the transient power supply. Transient arrival time determinator 156 also determines a late mode transient arrival time for a clock signal from clock source 32 to arrive at each element in timing path 30 by calculating a late mode delay of each element in timing path 30 based on the transient power supply. A voltage waveform of the transient power supply may be determined by a variety of methods including a power supply simulation by voltage analyzer 144, as described above with respect to step S1. It is appreciated that that each element in a path may have a different voltage waveform applied to it, as the voltage on the IC varies both spatially and temporally, and thus a transient power supply may have associated with it many voltage waveforms.

According to one embodiment, transient AT determinator 156 determines an early mode delay of an element according to the following procedure:

(1) determining an element early arrival time for the clock signal to arrive at a clock input of the element;

(2) determining a voltage value of the transient power supply at the location of the element at the element early arrival time;

(3) calculating an interim early mode delay based on the voltage value at the location of the element at the element early arrival time;

(4) determining a maximum voltage value of the transient power supply at the location of the element within a time period of the interim early mode delay; and (5) calculating the early mode delay based on the determined maximum voltage value.

Transient AT determinator 156 determines a late mode delay of an element according to the following procedure:

(1) determining an element late arrival time for the clock signal to arrive at the clock input of the element;

(2) determining a voltage value of the transient power supply at the location of the element at the element late arrival time;

(3) calculating an interim late mode delay based on the voltage value at the location of the element at the element late arrival time;

(4) determining a minimum voltage value of the transient power supply at the location of the element within a time period of the interim late mode delay; and (5) calculating the late mode delay based on the determined minimum voltage value.

It is possible that an early arrival time and a late arrival time at an element are the same. For example, in clock path 20 of FIG. 3, the arrival time of a clock cycle at buffer 24 does not include a late and early value because wiring 22 does not produce late and early mode delays. In this case, an interim delay may be calculated based on the voltage value at the element location at the element arrival time and a maximum and a minimum voltage at the element location may be determined in the period of the interim delay. The maximum and minimum voltage at the element location may be used to calculate an early and a late mode delay of the element, respectively.

Figure 4:
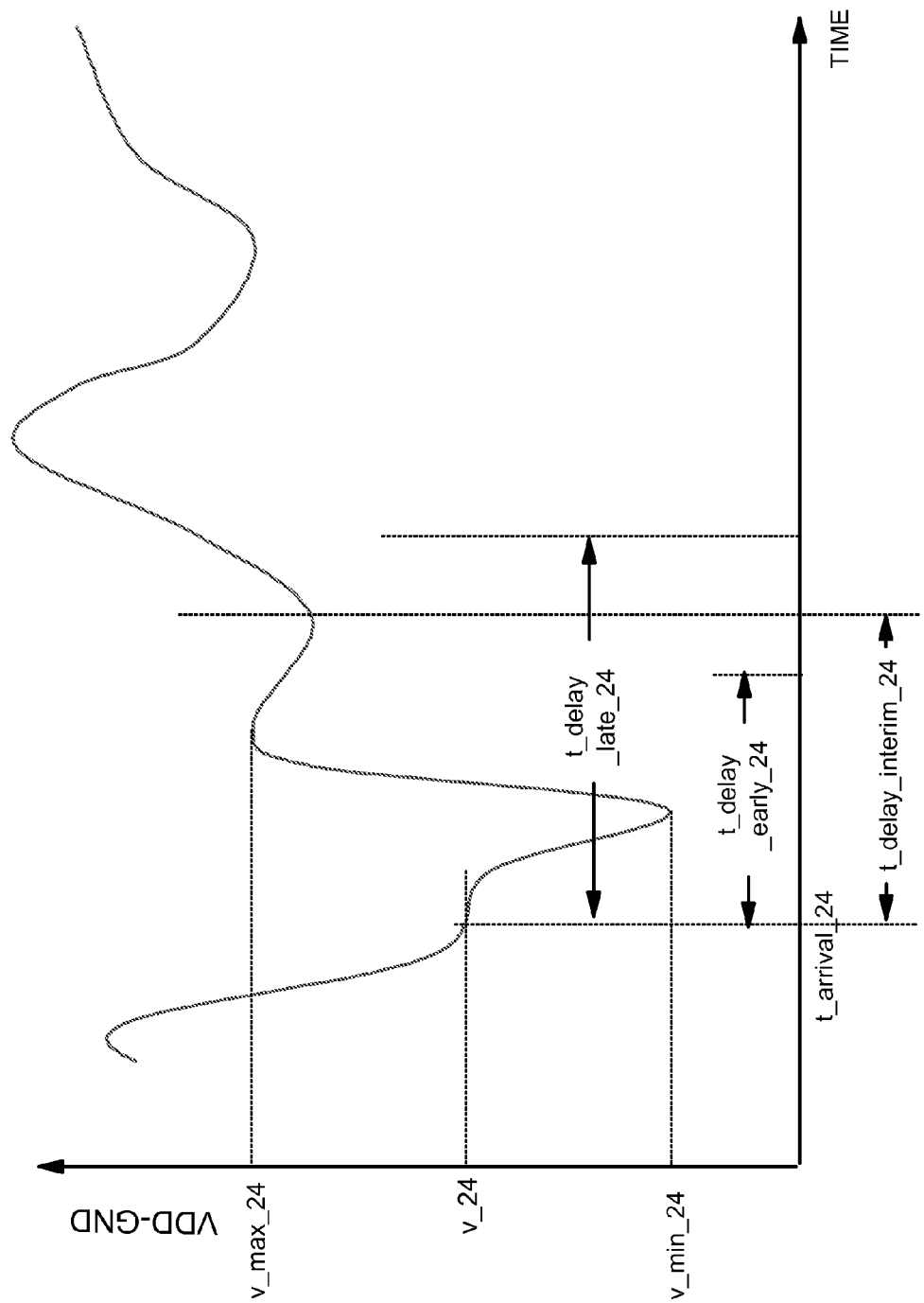
FIG. 4 shows an illustrative example of sampling a voltage value in determining an early and a late mode delay of an element under a transient power supply according to one embodiment of the invention.

FIG. 4 shows an illustrative example of sampling a voltage value in determining an early and a late mode delay of buffer 24 in propagating a clock cycle under a transient power supply according to the invention. According to FIG. 4, an early and late mode delay of buffer 24 may be determined following the procedures below:

(1) determining an arrival time at the active edge of buffer 24, t_arrival_24;

(2) determining a voltage supply value v_24 (VDD-GND) for buffer 24 at time t_arrival_24 from the power supply (VDD-GND) waveform for buffer 24 that may be produced by voltage analyzer 144 (FIG. 1);

(3) determining an interim propagation delay t_delay_interim_24 of the active edge of the clock cycle through buffer 24 using v_24;

(4) determining a minimum value v_min_24 and a maximum value v_max_24 of the power supply (VDD-GND) waveform for buffer 24 within the period t_arrival_24 to t_arrival_24+t_delay_interim_24;

(5) determining a late mode delay t_delay_late_24 of the active edge of the clock through buffer 24 using v_min_24; and (6) determining an early mode delay t_delay_early_24 of the active edge of the clock through buffer 24 using v_max_24.

Figure 5:
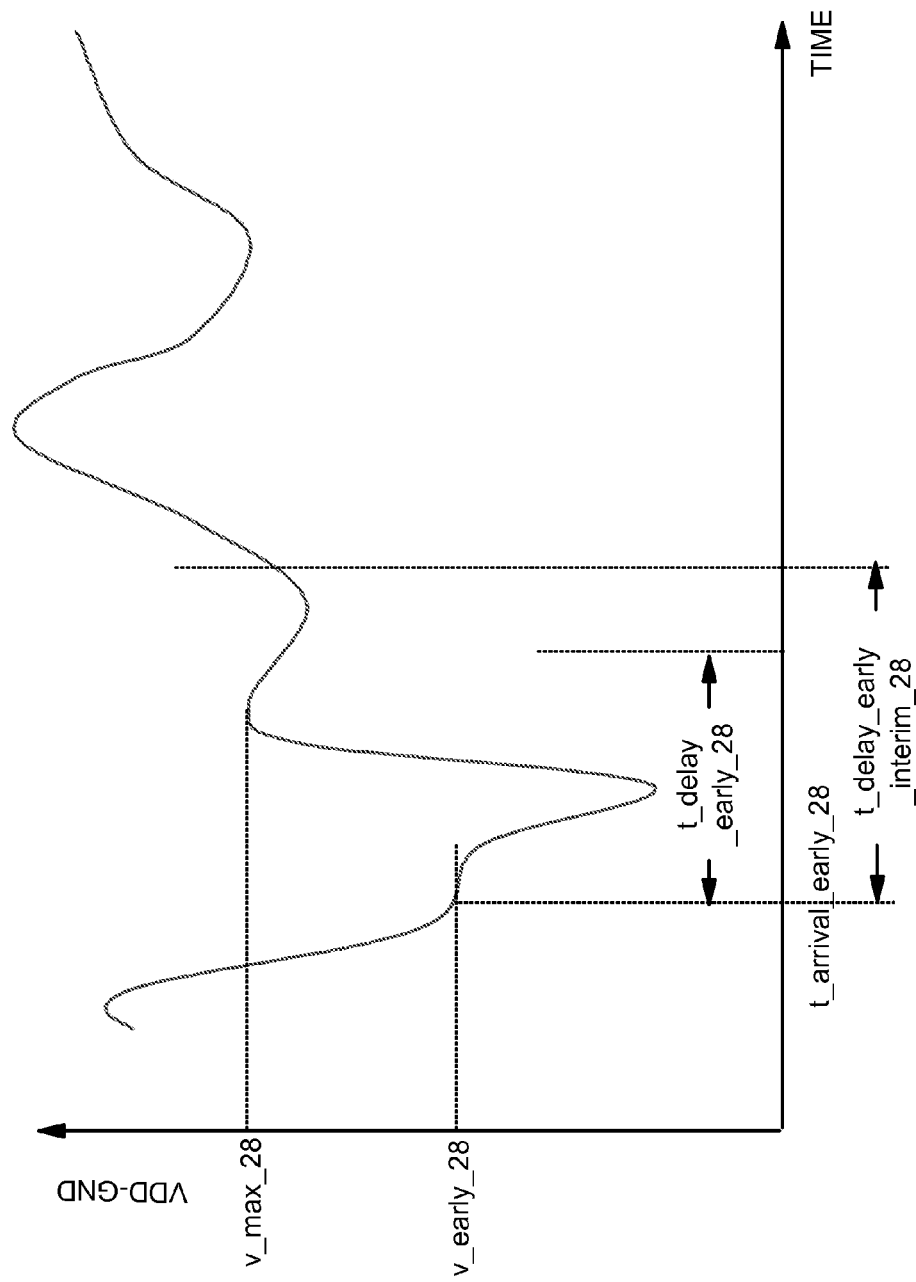
FIG. 5 shows an illustrative example of sampling a voltage value in determining an early mode delay of an element under a transient power supply according to one embodiment of the invention.

FIG. 5 shows an illustrative example of sampling a voltage value in determining an early mode delay of buffer 28 (FIG. 3) in propagating a clock cycle under a transient power supply according to the invention. According to FIG. 5, an early mode delay of buffer 28 may be determined following the procedures below:

(1) determining an early arrival time t_arrival_early_28 of the active edge of the clock cycle at the input to buffer 28;

(2) determining a voltage supply value v_early_28 (VDD-GND) for buffer 28 at the time t_arrival_early_28 from a power supply (VDD-GND) waveform for buffer 28;

(3) determining an interim early mode propagation delay t_delay_early_interim_28 of the active edge of the clock through buffer 28 using v_early_28;

(4) determining a maximum value v_max_28 of VDD-GND for buffer 28 within the period t_arrival_early_28 to t_arrival_early_28+t_delay_early_interim_28 from the VDD-GND waveform for buffer 28; and (5) determining an early mode propagation delay t_delay_early_28 of the active edge of the clock cycle through buffer 28 using v_max_28.

Figure 6:
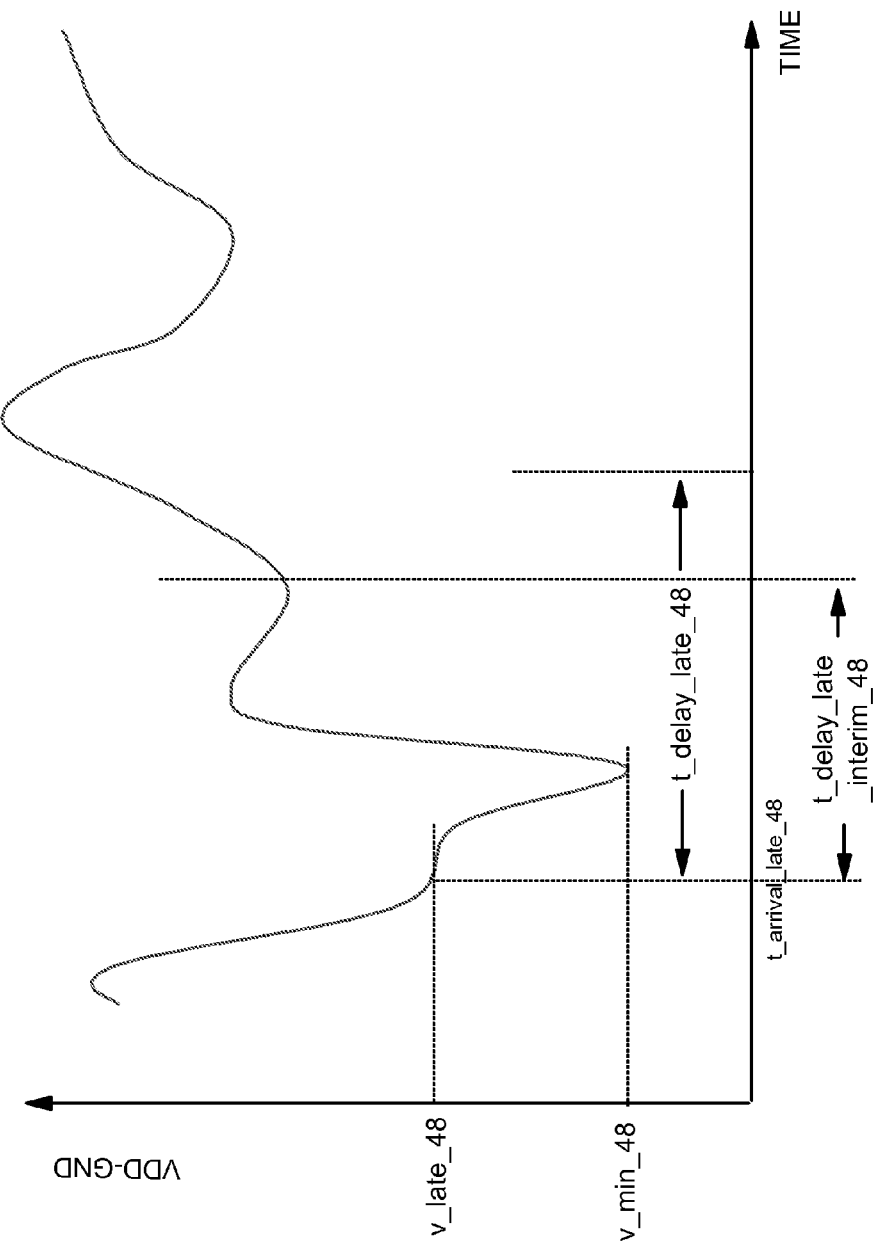
FIG. 6 shows an illustrative example of sampling a voltage value in determining a late mode delay of an element under a transient power supply according to one embodiment of the invention.

FIG. 6 shows an illustrative example of sampling a voltage value in determining a late mode delay of buffer 48 (FIG. 3) in propagating a clock cycle under a transient power supply according to the invention. According to FIG. 6, a late mode delay of buffer 48 may be determined following the procedures below:

(1) determining a late arrival time t_arrival_late_48 of the active edge of the clock cycle at the input to buffer 48;

(2) determining a voltage supply value v_late_48 (VDD-GND) for buffer 48 at the time t_arrival_late_48 from a power supply (VDD-GND) waveform for buffer 48;

(3) determining an interim late mode propagation delay t_delay_late_interim_48 of the active edge of the clock through buffer 48 using v_late_48;

(4) determining a minimum value v_min_48 of VDD-GND for buffer 48 within the period t_arrival_late_48 to t_arrival_late_48+t_delay_late_interim_48 from the VDD-GND waveform for buffer 48; and (5) determining a late mode propagation delay t_delay_late_48 of the active edge of the clock cycle through buffer 48 using v_min_28.

Following the similar procedures as illustrated above, transient AT determinator 156 may obtain an early mode transient arrival time of a clock signal at clock pin (C) 16 and a late mode transient arrival time of a data signal at data pin (D) 18 of endpoint 10.

It is appreciated that the above procedures may be used to determine an early mode transient arrival time and a late mode transient arrival time at clock pin (C) 16 and data pin (D) 18, respectively, and thus a transient static setup timing slack according to formula (1a), of one clock cycle. In step S4, early and late mode transient arrival times at clock pin (C) 16 and data pin (D) 18 for each and all clock cycles of a clock signal, during which timing path 30 is active, may all be determined. According to one embodiment, in the above procedures of determining transient arrival times, the minimum and maximum voltage values used to calculate late and early mode propagation delays of elements will be stored for later references.

Next in step S5, timing slack modifier 158 modifies the bounded timing slack of candidate timing path 30 based on the determined transient static timing slack in step S4. According to one embodiment, timing slack modifier 158 selects a transient static timing slack of a clock cycle that has a minimum value among all transient static timing slacks (for all clock cycles) obtained in step S4 to modify the bounded static timing slack of candidate timing path 30 (FIG. 3). The transient static timing slack of the minimum value among all transient static timing slacks is referred to as the minimum transient timing slack.

Any methods or policies may be used to determine the minimum transient timing slack, and are included in the current invention. According to one embodiment, an early mode transient arrival time at clock pin 16 and a late mode transient arrival time at data pin 18 for each clock cycle are compared to the early mode bounded arrival time at clock pin 16 and the late mode bounded arrival time at data pin 18 (step S4) to determine the minimum transient timing slack. The following formula may be used:

$$\min(\text{abs}(TAED\_n-TAET\_n)+\text{abs}(TALD\_n-TALT\_n)) \quad (4)$$

where TAED_n indicates the early mode bounded arrival time at clock pin 16 for clock cycle n; TAET_n indicates the early mode transient arrival time at clock pin 16 for clock cycle n; TALD_n indicates the late mode bounded arrival time at data pin 18 for clock cycle n; TALT_n indicates the late mode transient arrival time at data pin 18 for clock n; function min ( ) selects the cycle number n producing the minimum value; and function abs ( ) obtains the absolute value. As stated previously, the bounded arrival time values normally differ only due to different clock arrival times at the clock source, so for a clock cycle time of T, TALD_n=TALD_1+(n−1)*T, and TAED_n=TAED_1+(n−1)*T.

Formula (4) works under the assumption that the initial set of pairs of bounding voltage supplies produces the minimum static timing slack, e.g., maximum and minimum values of VDD-GND over the entire transient voltage waveforms at each element location are used for the initial set of pairs of bounding voltage supplies. If this assumption does not fit, formula (4) may not be used and other methods may be used to select a minimum transient timing slack.

Any now know or later developed methods for modifying a static timing slack may be used in step S5. According to one embodiment, timing slack modifier 158 produces timing adjustments and applies the same to the timing model of the candidate timing path, here, e.g., path 30 (FIG. 3). A timing report for candidate path 30 with the modified timing model is then regenerated by timing slack analyzer 148, which represents a modified static timing slack of the candidate timing path.

Next in step S6, operation controller 160 compares the modified static timing slack of the candidate timing path with an originally second minimum bounded static timing slack of a different timing path leading to the endpoint. Here, for example, timing path 50 of endpoint 10 has the second minimum bounded static timing slack, −227, which is originally generated in step S3. If the modified static timing slack of the candidate timing path, here timing path 30, is still less than the originally second minimum bounded timing slack of a different timing path, here timing path 50, the operation of TSAM 132 ends with respect to the current endpoint, here endpoint 10, and moves to a next endpoint. This is done because the modified static timing slack of the candidate timing path, here of path 30, is a lower bound on the minimum static timing slack of the endpoint, and further analysis any other timing path to the endpoint, e.g., timing path 50, cannot improve (increase) this lower bound. In addition, the modifications and timing adjustments are saved for, e.g., an external use, and may be communicated to, e.g., operator 164 (FIG. 1). If the modified timing slack of candidate timing path 30 becomes more positive than the original second minimum bounded timing slack of timing path 50, the modified static timing slack of path 30 is not a lower bound on the minimum static timing slack of endpoint 10, and timing path 50 will become a new candidate timing path to be analyzed. In this case, the operation of TSAM system 132 goes back to step S3 and reiterates until ending.

4. CONCLUSION

While shown and described herein as a method and system for analyzing and modifying a static timing slack of a timing path in a static timing analysis of a design of an integrated circuit (IC) with a transient power supply, it is understood that the invention further provides various alternative embodiments. For example, in one embodiment, the invention provides a program product stored on a computer-readable medium, which when executed, enables a computer infrastructure to analyze and modify a static timing slack of a timing path in a static timing analysis of a design of an integrated circuit (IC) with a transient power supply. To this extent, the computer-readable medium includes program code, such as TSAM system 132 (FIG. 1), which implements the process described herein. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 120 (FIG. 2) and/or database 128 (FIG. 1), and/or as a data signal traveling over a network (e.g., during a wired/wireless electronic distribution of the program product).

In another embodiment, the invention provides a method of generating a system for analyzing and modifying a static timing slack of a timing path in a static timing analysis of a design of an integrated circuit (IC) with a transient power supply. In this case, a computer infrastructure, such as computer system 100 (FIG. 1), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing system 100 (FIG. 1), from a computer-readable medium; (2) adding one or more computing devices to the computer infrastructure; and (3) incorporating and/or modifying one or more existing systems of the computer infrastructure, to enable the computer infrastructure to perform the process steps of the invention.

In still another embodiment, the invention provides a business method that performs the process described herein on a subscription, advertising supported, and/or fee basis. That is, a service provider could offer to analyze and modify a static timing slack of a timing path in a static timing analysis of a design of an integrated circuit (IC) with a transient power supply as described herein. In this case, the service provider can manage (e.g., create, maintain, support, etc.) a computer infrastructure, such as computer system 100 (FIG. 1), that performs the process described herein for one or more customers and communicates the results of the static timing slack analysis and modification to the one or more customers. In return, the service provider can receive payment from the customer(s) under a subscription and/or fee agreement and/or the service provider can receive payment from the sale of advertising to one or more third parties.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like. Further, it is understood that the terms "component" and "system" are synonymous as used herein and represent any combination of hardware and/or software capable of performing some function(s).

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A method for analyzing and modifying a static timing slack of a timing path in a static timing analysis of a design of an integrated circuit (IC) with a transient power supply, the method comprising steps of:

constructing a timing model of an IC based on an upper end voltage supply and a lower end voltage supply using a computer;

selecting an endpoint in the IC to perform a static timing slack analysis on the endpoint based on the upper end voltage supply and the lower end voltage supply;

selecting a candidate timing path with a bounded static timing slack of a minimum value among all timing paths leading to the selected endpoint based on the static timing slack analysis;

determining a transient static timing slack of the candidate timing path based on the transient power supply using a computer; and modifying the bounded static timing slack of the candidate timing path based on the transient static timing slack using a computer wherein the transient static timing slack includes calculating a late mode delay of a first signal in an element in a second path leading to the endpoint based on the transient power supply, and the late mode delay calculating includes;
  determining a late mode arrival time for the first signal to arrive at an input of the element;
  determining a voltage value of the transient power supply on the element at the late mode arrival time;
  calculating an interim late mode delay based on the voltage value on the element at the late arrival time;
  determining a minimum voltage value of the transient power supply on the element within a time period of the interim late mode delay; and
  calculating the late mode delay based on the determined minimum voltage value.

2. The method of claim 1, wherein the transient static timing slack determining step includes determining a late mode arrival time for a first signal to arrive at an element in the first path leading to the endpoint based on the transient power supply and determining an early mode arrival time for a second signal to arrive at an element in a second path leading to the endpoint based on the transient power supply.

3. The method of claim 1, wherein the transient static timing slack determining step includes calculating an early mode delay of a second signal in an element in a second path leading to the endpoint based on the transient power supply.

4. The method of claim 3, wherein the early mode delay calculating step includes:
  determining an early mode arrival time for the second signal to arrive at an input of the element;
  determining a voltage value of the transient power supply on the element at the early mode arrival time;
  calculating an interim early mode delay based on the voltage value on the element at the early mode arrival time;
  determining a maximum voltage value of the transient power supply on the element within a time period of the interim early mode delay; and
  calculating the early mode delay based on the determined maximum voltage value.

5. The method of claim 1, wherein the transient static timing slack determining step is performed for each clock cycle of a clock signal to obtain a transient static timing slack for each clock cycle.

6. The method of claim 5, wherein the modifying step is based on a transient static timing slack of a minimum value among all the obtained transient static timing slacks.

7. The method of claim 1, further comprising a step of comparing the modified static timing slack of the candidate timing path with a bounded static timing slack of a second different timing path leading to the endpoint to determine whether the bounded static timing slack of the second different timing path needs to be modified.

8. A system for analyzing and modifying a static timing slack of a timing path in a static timing analysis of a design of an integrated circuit (IC) with a transient power supply, the system comprising:
  at least one computing device configured to analyze and modify a static timing slack of a timing path in a static timing analysis of a design of an integrated circuit with a transient power supply by performing a method including;
  selecting an upper end voltage supply and a lower end voltage supply to be used in constructing a timing model of an IC;
  selecting an endpoint in the IC to perform a static timing slack analysis on the endpoint based on the upper end voltage supply and the lower end voltage supply;
  selecting a candidate timing path with a bounded static timing slack of a minimum value among all timing paths leading to the selected endpoint based on the static timing slack analysis;
  determining a transient static timing slack of the candidate timing path based on the transient power supply; and
  modifying the bounded static timing slack of the candidate timing path based on the transient static timing slack, wherein the transient static timing slack includes calculating a late mode delay of a first signal in an element in a second path leading to the endpoint based on the transient power supply, and the late mode delay calculating includes;
  determining a late mode arrival time for the first signal to arrive at an input of the element;
  determining a voltage value of the transient power supply on the element at the late mode arrival time;
  calculating an interim late mode delay based on the voltage value on the element at the late arrival time;
  determining a minimum voltage value of the transient power supply on the element within a time period of the interim late mode delay; and
  calculating the late mode delay based on the determined minimum voltage value.

9. The system of claim 8, wherein the transient static timing slack determining includes calculating an early mode delay of a second clock signal in an element in a second path leading to the endpoint based on the transient power supply.

10. The system of claim 9, wherein the early mode delay calculating includes:
  determining an early mode arrival time for the second signal to arrive at an input of the element;
  determining a voltage value of the transient power supply on the element at the early mode arrival time;
  calculating an interim early mode delay based on the voltage value on the element at the early mode arrival time;
  determining a maximum voltage value of the transient power supply on the element within a time period of the interim early mode delay; and
  calculating the early mode delay based on the determined maximum voltage value.

11. A non-transitory computer readable medium comprising a computer program product stored thereon, which when executed, enables a computer system to execute a method for analyzing and modifying a static timing slack of a timing path in a static timing analysis of a design of an integrated circuit (IC) with a transient power supply, the method comprising:
  selecting an upper end voltage supply and a lower end voltage supply to be used in constructing a timing model of an IC;
  selecting an endpoint in the IC to perform a static timing slack analysis on the endpoint based on the upper end voltage supply and the lower end voltage supply;
  selecting a candidate timing path with a bounded static timing slack of a minimum value among all timing paths leading to the selected endpoint based on the static timing slack analysis;
  determining a transient static timing slack of the candidate timing path based on the transient power supply; and
  modifying the bounded static timing slack of the candidate timing path based on the transient static timing slack, wherein the transient static timing slack includes calculating a late mode delay of a first signal in an element in a second path leading to the endpoint based on the transient power supply, and the late mode delay calculating includes;

determining a late mode arrival time for the first signal to arrive at an input of the element;

determining a voltage value of the transient power supply on the element at the late mode arrival time;

calculating an interim late mode delay based on the voltage value on the element at the late arrival time;

determining a minimum voltage value of the transient power supply on the element within a time period of the interim late mode delay; and calculating the late mode delay based on the determined minimum voltage value.

12. The non-transitory computer readable medium of claim 11, wherein the transient static timing slack determining includes determining a late mode arrival time for a first signal to arrive at an element in a first path leading to the endpoint based on the transient power supply and determining an early mode arrival time for a second signal to arrive at an element in a second path leading to the endpoint based on the transient power supply.

13. The non-transitory computer readable medium of claim 11, wherein the transient static timing slack determining includes calculating an early mode delay of a second signal in an element in a second path leading to the endpoint based on the transient power supply.

14. The non-transitory computer readable medium of claim 13, wherein the early mode delay calculating includes:

determining an early mode arrival time for the second signal to arrive at an input of the element;

determining a voltage value of the transient power supply on the element at the early mode arrival time;

calculating an interim early mode delay based on the voltage value on the element at the early mode arrival time;

determining a maximum voltage value of the transient power supply on the element within a time period of the interim early mode delay; and calculating the early mode delay based on the determined maximum voltage value.

15. The non-transitory computer readable medium of claim 11, wherein the transient static timing slack determining is performed for each clock cycle of a clock signal to obtain a transient static timing slack for each clock cycle.

16. The non-transitory computer readable medium of claim 15, wherein the modifying is based on a transient static timing slack of a minimum value among all the obtained transient static timing slacks.

17. The non-transitory computer readable medium of claim 11, wherein the program code is further configured to compare the modified static timing slack of the candidate timing path with a bounded static timing slack of a second different timing path leading to the endpoint to determine whether the bounded static timing slack of the second different timing path needs to be modified.

* * * * *